United States Patent
Ami et al.

[11] Patent Number: 5,976,624
[45] Date of Patent: Nov. 2, 1999

[54] PROCESS FOR PRODUCING BISMUTH COMPOUNDS, AND BISMUTH COMPOUNDS

[75] Inventors: Takaaki Ami; Katsuyuki Hironaka; Yuji Ikeda, all of Kanagawa, Japan

[73] Assignee: Sony Corporation, Tokyo, Japan

[21] Appl. No.: 08/700,030

[22] Filed: Aug. 20, 1996

[30] Foreign Application Priority Data

Aug. 22, 1995 [JP] Japan ................................. 7-213694

[51] Int. Cl.[6] .................................................. C23C 16/40
[52] U.S. Cl. .................... 427/255.32; 427/377; 427/378; 427/383.1
[58] Field of Search .......................... 427/62, 79, 126.3, 427/226, 255.3, 377, 255.32, 378, 383.1; 505/473, 731, 732, 742; 204/192.24, 192.22

[56] References Cited

U.S. PATENT DOCUMENTS

| 5,330,966 | 7/1994 | Hayashi et al. | 505/473 |
| 5,423,285 | 6/1995 | Paz De Araujo et al. | 117/90 |
| 5,426,075 | 6/1995 | Perino et al. | 437/235 |
| 5,527,567 | 6/1996 | Desu et al. | 427/573 |

FOREIGN PATENT DOCUMENTS 57-158369  9/1982  Japan.

OTHER PUBLICATIONS

Y. Shimada et al. Temperature effects on charge retention characteristics of integrated $SrBi_2(Ta,Nb)_2O_g$ capacitors, Appl. Phys. Lett. 71 (17) Oct. 27, 1997.

P. Rajasekar et al. SIMS of $Y_1Ba_2Cu_3O_{7-x}$ and $(Bi,Pb)_2Sr_2Ca_2Cu_3O_{10+\delta}$ superconductors, Vacuum/vol. 43/No. 3, pp. 215 to 218/1992. (no month).

Yasuhiko Syono et al. Chemistry of superconducting Cu oxides with the block layers consisting of Tl, Pb and Bi ions, Physica C 190, pp. 9–13 1991 (no month).

Narasimha et al., Restoration of superconductivity in $YSrBaCu_{2.6}Fe_{0.4}O_{6+z}$ (no date).

Karppinen et al. Valence studies on various superconductung bismuth and lead cuprates and related materials, Physics 1993, pp. 130–136. (no month).

Shin–ichi Koriyama et al. Superconducting Lead cuprates $(Pb_{9.5}Cu_{0.5})(Sr_{1-y}Bay)_2(Y_{1-z}Caz)Cu_2Ou$, The American Physical Society Apr. 1992.

Yasuhiro Shimada et al. Retention Characteristics of a Ferroelectric Memory Based on $SrBi_2(Ta,Nb)_2O_g$, Appl. Phys. vol. 36 (1997) pp. 5912–5916. (no month).

Takashi Mihara et al. Characteristics of Bismuth Layered $SrBi_2Ta_2O_g$ Thin–Film Capacitors and Comparison with $Pb(Zr, Ti)O_3$, Appl. Phys. vol. 34 (Sep. 1995) pp. 5233–5239.

Applied Physics Letters, vol. 68, No. 5, Jan. 29, 1996, pp. 616–618, XP 000556091, Tingkai Li, et al., "Metalorganic Chemical Vapor Deposition of Ferroelectric $SrBi_2Ta_2O_9$ Thin Films".

Integrated Ferroelectrics, vol. 10, No. 1/04, 1995, pp. 9–22, XP 000609935, P.C. Van Buskirk, et al., "Manufacturing of Perovskite Thin Films Using Liquid Delivery MOCVD" (no month).

*Primary Examiner*—Timothy Meeks
*Attorney, Agent, or Firm*—Hill & Simpson

[57] ABSTRACT

The formation of an electrically conductive phase in an dielectric or ferroelectric composed of a bismuth compound is inhibited. Described is a process for producing a bismuth compound, which comprises introducing a gas of starting materials in an atmosphere under a pressure of 0.01 to 50 torr, depositing a precursor of a bismuth compound on a substrate, and thermally treating it in an oxidizing atmosphere.

1 Claim, 5 Drawing Sheets

PROCESS FOR PRODUCING BISMUTH COMPOUNDS, AND BISMUTH COMPOUNDS

BACKGROUND OF THE INVENTION

1. Field of the Invention

The present invention relates to a process for producing a useful bismuth compound used in electric devices such as ferroelectric memory etc. as well as to a dielectric ferroelectric of a bismuth compound.

2. Description of the Related Art

The bismuth-layered compound forms a group of industrially extremely important compounds such as bismuth series superconducting oxides with a critical temperature of 110 K, or materials for ferromagnetic memory etc. For application of these compounds to electric devices, it is essential to develop a thin film process.

The structure of this bismuth-layered compound is found in e.g. $Bi_2PbNb_2O_9$ and is represented by a repeating structure in a pseudo-tetragonal system having a layer of bismuth oxide and a layer of an oxide of another element laminated repeatedly in a definite order and extended in column shape along the c axis direction (see G. A. SMOLENSKII et al., SOVIET PHYSICS-SOLID STATE, pp. 651–655 (1961)) and E. C. SUBBARAO, J. Phys. Chem. Solids Pergamon Press, Vol. 23, pp. 665–676 (1962)).

In this repeating structure, the number of bismuth oxide layers in 1 unit structure and the length of 1 unit structure vary depending on an individual bismuth-layered compound.

At present, the application of this bismuth-layered compound to electric devices is attempted, and in such an attempt, a thin layer of a bismuth-layered compound excellent in ferroelectric properties is obtained by spin coating methods including metal organic decomposition (MOD) etc.

OBJECT AND SUMMARY OF THE INVENTION

The phenomenon of short-circuiting can occur in capacitors using this bismuth-layered compound. This phenomenon is considered to be caused for various reasons including a hillock on the bottom platinum electrode, and one of the possible reasons is the presence of an electrically conductive phase resulting from inappropriate composition.

Hence, the present inventors found that it becomes necessary to develop a production process for inhibiting the formation of this electrically conductive phase. Particularly in a production process where oxidation and crystallization are carried out by post-annealing after preparation of a thin film, it is important to control the composition at the time of film forming.

To solve the above-described problem, the object of the present invention is to provide a process for producing a capacitor composed of a bismuth-layered compound with a low degree of the appearance of the phenomenon of short-circuiting (low degree of short-circuiting) by controlling the composition in the preparing process to inhibit the formation of the electrically conductive phase.

The present invention is a process for producing a bismuth compound, which comprises a first step of introducing a gas of starting materials in an atmosphere under a pressure of 0.01 to 50 torr to prepare a precursor of a bismuth compound on a substrate, and a second step of thermally treating the precursor in an oxidizing atmosphere.

Further, the present invention is a dielectric ferroelectric of a bismuth compound, which comprises a bismuth-layered compound as a main phase and a composite oxide of pyrochlore structure as a secondary phase.

According to the constitution of the present invention as described above, a gas of starting materials is introduced in an oxidizing atmosphere whereby a precursor of a bismuth compound can be deposited on a substrate, and it is thermally treated in the oxidizing atmosphere whereby a highly insulating bismuth compound containing a bismuth-layered compound as a main phase and a highly insulating by-product such as a compound of pyrochlore structure can be obtained.

DESCRIPTION OF THE PREFERRED EMBODIMENT

Figure 1:
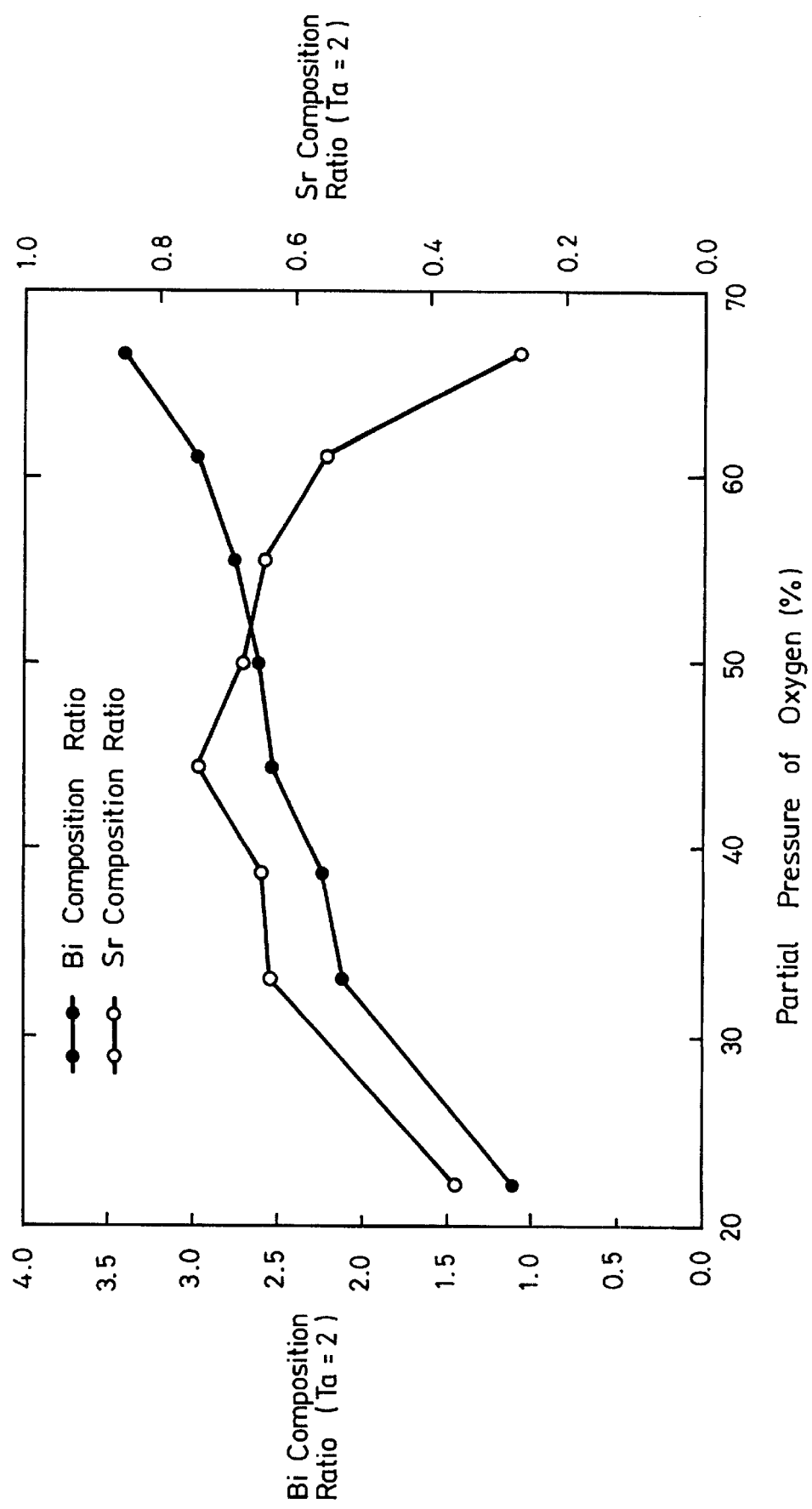
FIG. 1 shows the relationship between the partial pressure of oxygen in the range of 20 to 70% and the composition of the resulting thin film.

The process for producing a bismuth compound according to the present invention involves introducing a gas of starting materials in an atmosphere under a pressure of 0.01 to 50 torr, depositing a precursor of a bismuth compound on a substrate, and thermally treating it in an oxidizing atmosphere.

In the production of the bismuth compound of the present invention, a thin film of a precursor is first formed, and a wide variety of conventional film forming methods can be used in this step. As the film forming methods that can be used, mention may be made of spin coating method such as sol/gel method, MOD method etc., Liquid Source Misted Chemical Deposition (LSMCD) method, chemical vapor deposition (CVD) method using metal halide (metal hydride), Metal Organic Chemical Vapor Deposition (MOCVD) method using DiPivaloylMethanato (DPM) etc. as a source, flash CVD method where a source is transferred and mixed in a liquid phase and then evaporated under rapidly reduced pressure in a reactor, physical deposition methods such as vacuum deposition, molecular beam epitaxy (MBE), laser ablation (LA), sputtering, etc.

In the process for producing a bismuth compound according to the present invention, examples of desired bismuth compounds are bismuth-layered compounds having the formula $Bi_2(Sr, Ba, Ca)(Ta, Nb)_2O_9$ used as ferroelectrics.

For the production of these bismuth-layered compounds, it is important for the composition of a thin film of a precursor to contain tantalum or niobium in slight excess relative to the composition of the desired bismuth-layered compounds. Contrary to this, alkaline earths such as strontium etc. are made slightly short.

In each of the film forming methods described above, charge composition (in the case of the sol/gel method and the MOD method) or film forming conditions (in the case of the LSMCD, CVD, MOCVD, flash CVD, MBE, LA and sputtering method) are controlled so as to attain such desired composition.

Film forming conditions for thin film as a precursor are preferably as follows.

Reaction temperature: 400 to 700° C.

Reaction gas pressure: 0.01 to 50 torr.

Reaction gas: in an oxidizing gas containing at least 5% oxygen.

Annealing conditions of thin film as a precursor are preferably as follows.

Annealing temperature: from a temperature for film forming to 850° C.

Atmosphere: oxidizing atmosphere.

The capacitor material prepared under such conditions contains small amounts of secondary phase such as composite oxides with pyrochlore structure besides the desired bismuth-layered compound.

Composite oxides with pyrochlore structure of the formula (Bi, (Sr, Ba, Ca))$_{2-x}$(Ta, Nb)$_2$O$_{7\pm\delta}$ are formed as by-products where the main phase is a bismuth-layered compound of the formula Bi$_2$(Sr, Ba, Ca)(Ta, Nb)$_2$O$_9$.

Dielectric or ferroelectric capacitors prepared using such capacitor material have a low degree of short-circuiting because the material does not contain any electrically conductive phase.

Hereinafter, the process for producing a bismuth compound according to the present invention is illustrated by reference to the production of a bismuth-layered compound of the formula Bi$_2$SrTa$_2$O$_9$ among the above bismuth-layered compounds.

Among the above-mentioned film forming methods, the flash CVD method will be illustrated for film forming.

The substrate used is SiO$_2$ having Ti and Pt deposited sequentially on it by sputtering.

The CVD source is suitably selected from BiPh$_3$ (triphenylbismuth), Bi(O-Tol)$_3$ etc. as Bi source, Sr(DPM)2 (dipivaloyl methanate-strontium), Sr(Me$_5$C$_5$)$_2$·2THF etc. as Sr source, and Ta(OCH$_3$)$_5$, Ta(O-iPr)$_5$ etc. as Ta source.

These source materials are dissolved in an organic solvent etc. and transferred in liquid form and introduced with an argon (Ar) carrier gas into a reactor. In this step, the source solution is preferably vaporized in a vaporization unit under a rapidly reduced pressure of about 0.1 to 10 torr and introduced in a vapor phase into the reactor where the vapor is deposited on a substrate in the reactor. When pure oxygen is used as an oxidizing gas, the flow is fed to the reactor while the partial pressure of oxygen is controlled in the range of 20 to 50% or thereabout relative to the total pressure.

If the partial pressure of oxygen is less than 20%, none of the bismuth-layered compound will result with the composite oxide with pyrochlore structure forming as the main phase, while if the partial pressure of oxygen exceeds 50%, it is disadvantageous that none of the oxide of pyrochlore structure will be formed as secondary phase.

A suitable mixing ratio for the respective sources is determined preferably in the following manner. A thin film is experimentally prepared and then analyzed for its composition in an electron probe microanalyzer (EPMA), fluorescence X ray spectroscopy etc., and the mixing ratio for the source materials is controlled according to the analysis result so that the best mixing ratio is determined.

If the compounding ratio of the fed source materials is suitable, then a thin film of a precursor which is fluorite-structured crystals but partially amorphous can be obtained at a substrate temperature of 400 to 750° C. or thereabout.

The precursor thus obtained is thermally treated preferably at 800° C. for 1 hour in an oxidizing atmosphere, preferably in a stream of oxygen under normal pressure, whereby a thin film containing the bismuth-layered compound Bi$_2$SrTa$_2$O$_9$ as a main phase and composite oxides (Bi, Sr)$_{2-x}$Ta$_2$O$_{7\pm\delta}$ with pyrochlore structure as a secondary phase.

A capacitor is formed by providing the resulting thin film with a film of platinum top electrode by e.g. sputtering to permit the determination of its electric characteristics.

If the capacitor is free of the composite oxides (Bi, Sr)$_{2-x}$Ta$_2$O$_{7\pm}$ with pyrochlore structure, a high degree of short-circuiting results and it is conceivable that an electrically conductive phase has occurred.

As opposed to this, the degree of short-circuiting is lowered with an increasing content of composite oxides with pyrochlore structure, and the formation of the above-described electrically conductive phase is considered difficult in these compositions.

Hence, the process for producing the bismuth compound of the present invention, according to which the degree of short-circuiting of a capacitor is lowered by secondary phase of composite oxides with pyrochlore structure, is useful.

The composite oxides with pyrochlore structure secondarily formed in this step may have the pyrochlore structure in a cubic system, structures in a cubic system slightly altered due to lattice strain etc., or similar structures.

In addition, the composite oxides with pyrochlore structure are relatively nonstoichiometric and may thus deviate from the pyrochlore structure in respect of their composition and structure in some cases.

Hereinafter, the process for producing a bismuth compound according to the present invention is illustrated by reference to a specific example.

The following example illustrates the preparation of a capacitor of a ferroelectric film composed of the bismuth-layered compound having the formula Bi$_2$SrTa$_2$O$_9$.

100 nm each of Ti and Pt are subsequently accumulated by sputtering at room temperature on the (100) face of spontaneously oxidized silicon to form a substrate.

Source materials in the CVD method, such as BiPh$_3$, Sr(DPM)$_2$, Ta(O-iPr)$_5$, etc., are selected and these source materials are dissolved in organic solvent such as tetrahydrofuran (THF) etc. to prepare about 0.1 M/L of each solution.

These solutions are mixed so as to attain the initial ratio of Bi/Sr/Ta (2/½) by atomic composition, then transferred and introduced to an vaporization unit. The vaporization unit has previously been heated such that the source materials are not deposited to be adhered onto its inside wall.

The vapor from the solution is introduced with an Ar carrier gas into a reactor.

The vaporization unit and the reactor have previously been reduced to 10 torr or thereabout to evaporate the source solution. The vapor from the source solution is transferred in a gas phase to, and deposited on, the substrate.

For deposition, the substrate has previously been heated at 600° C. or thereabout.

Separately, an oxidizing gas such as pure oxygen etc. is introduced directly into the reactor without passing it through the vaporization unit.

The Ar carrier gas and the oxidizing gas are fed to the reactor respectively under the control of a mass flow controller, preferably adjusting the total flow to 1800 sccm and the partial pressure of oxygen to about 20 to 50%.

In this manner, a thin film of a precursor whose main phase is fluorite-structured crystals but partially amorphous can be obtained.

Subsequently, this thin film of the compound with fluorite structure is thermally treated at 800° C. for 1 hour in a stream of oxygen under normal pressure.

As a result, the thin film containing the desired formula $Bi_2SrTa_2O_9$ as the main phase and the composite oxides $(Bi, Sr)_{2-x}Ta_2O_{7\pm\delta}$ with pyrochlore structure as the secondary phase could be obtained.

Thin films obtained by varying the partial pressure of oxygen in the range of 20 to 70% were examined for their compositions. The temperature and pressure for film forming are 600° C. and 10 torr respectively.

The relationship between the partial pressure of oxygen and the composition of the resulting thin film is shown in FIG. 1. FIG. 1 shows the ratio of bismuth (●) to strontium (○) in each composition when the ratio of tantalum in the composition was normalized as 2.

As can be seen from FIG. 1, tantalum becomes rich while bismuths and strontium become relatively poor with a decreasing partial pressure of oxygen.

Figure 2:
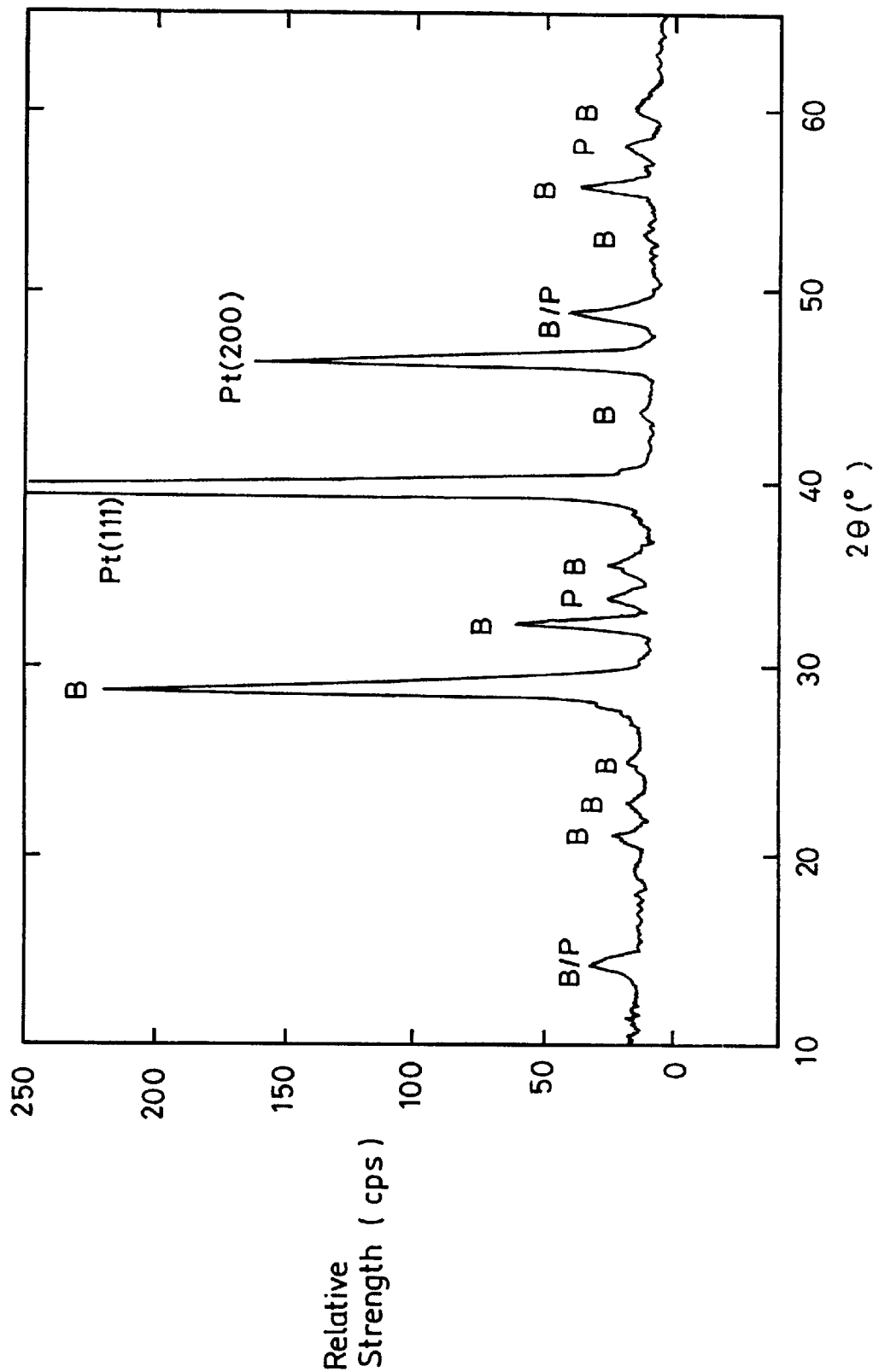
FIG. 2 shows an X ray diffraction pattern of a thin film obtained under 38.9% oxygen partial pressure.

FIG. 2 shows an X ray diffraction pattern of a thin film obtained under 38.9% oxygen partial pressure.

In FIG. 2, the peaks designated Pt are attributable to Pt deposited for the bottom electrode on the substrate under the thin film, the peaks designated B are attributable to the bismuth-layered compounds as the object, the peaks P are attributable to the secondary phase with pyrochlore structure.

As can be seen from FIG. 2, the bismuth-layered compounds as the object are formed as the main phase while small amounts with oxides with pyrochlore structure occur as the secondary phase.

Figure 3:
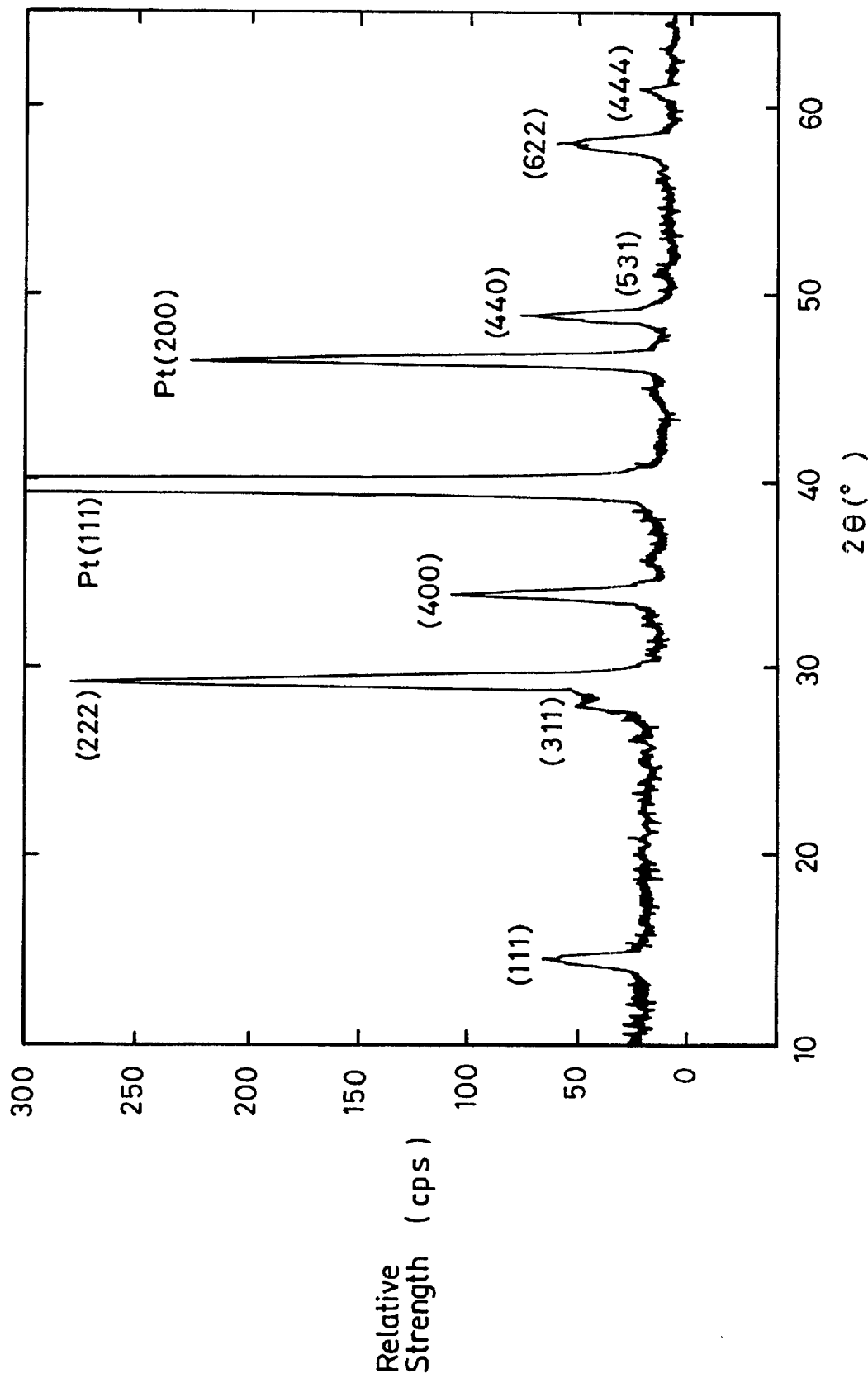
FIG. 3 shows an X ray diffraction pattern of a thin film obtained under 22.2% oxygen partial pressure.

This secondary phase with pyrochlore structure can be separated into an almost single phase by further reducing the partial pressure of oxygen at the time of film forming. FIG. 3 shows an X ray diffraction pattern of a thin film obtained under 22.2% oxygen partial pressure. The peaks are designated numerals indicating their crystal faces.

Strong peaks in FIG. 3, which are attributable to reflection on the faces (111), (311), (222), (400), (440), (531), (622) and (444) respectively, well represent the characteristics of the pyrochlore structure.

Figure 4:
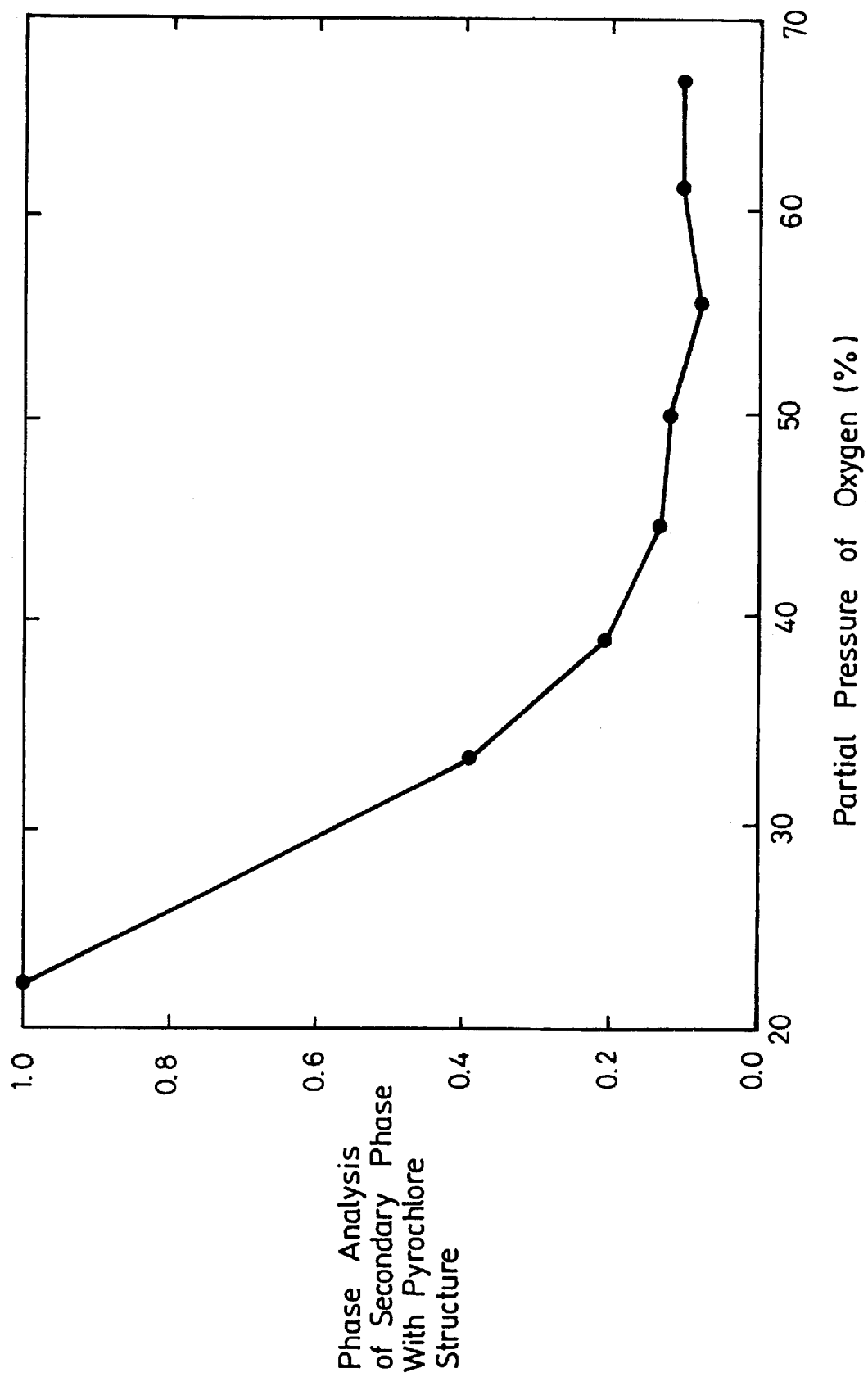
FIG. 4 shows the dependence of the ratio of the bismuth-layered compound to the secondary phase with pyrochlore structure as the formed phases on the partial pressure of oxygen.

FIG. 4 shows the dependence of the ratio of the bismuth-layered compound to the secondary phase with pyrochlore structure as the formed phases on the partial pressure of oxygen. In this figure, the strength of the main peak (222) face was calculated from the peak of the secondly strong (400) face of the secondary phase with pyrochlore structure, and the ratio of this strength to the strength of the main peak of the bismuth-layered compound was determined for approximate estimation.

It can be seen that the ratio of the secondary phase with pyrochlore structure as a phase in the composition is increased with a decreasing partial pressure of oxygen (FIG. 4) or with increasing tantalum (FIG. 3).

To evaluate the characteristics of the thin film prepared in this example, an upper platinum electrode of about 200 nm was formed on the thin film by sputtering and the remnant polarization 2Pr of this thin film was determined.

Figure 5:
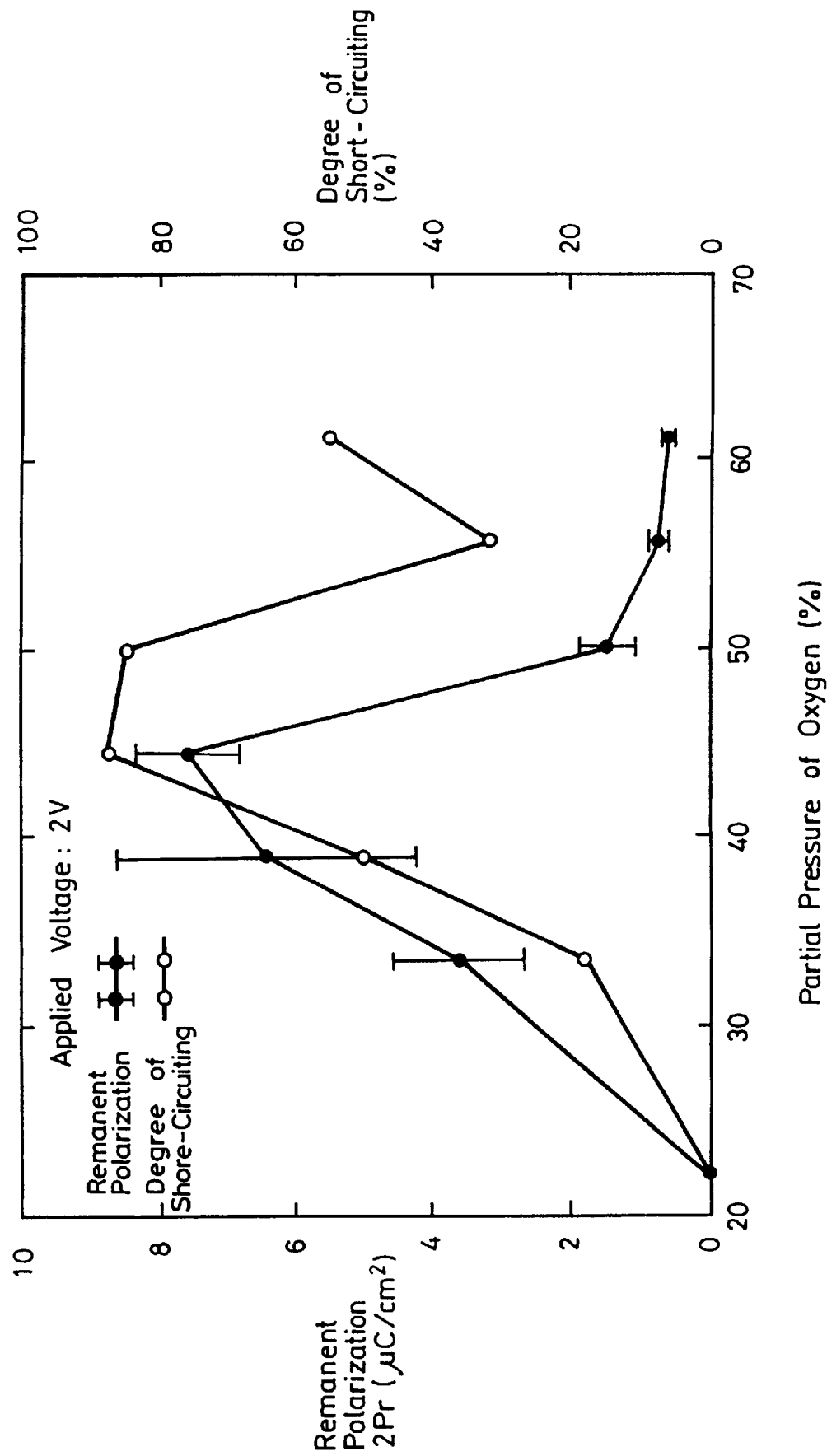
FIG. 5 shows the relationship among the partial pressure of oxygen, the remnant polarization and the degree of short-circuiting.

The remnant polarization 2Pr and the degree of short-circuiting of the electrode were determined with an applied voltage of 2 V. The relationship among the partial pressure of oxygen at the time of film forming, the remnant polarization and the degree of short-circuiting is shown in FIG. 5. In FIG. 5, the symbol ● indicates the remnant polarization 2Pr, and the symbol ○ indicates the degree of short-circuiting.

As can be seen from FIG. 5, the degree of short-circuiting is decreased as the partial pressure of oxygen is decreased in the range of 45% or less, that is, as the secondary phase with pyrochlore structure is increased. Simultaneously, the ratio of the ferroelectric bismuth-layered compound as a phase is also decreased so that the remnant polarization 2Pr is decreased too.

Practically, the construction of a ferroelectric capacitor from the bismuth-layered compound requires establishment of the composition of the bismuth-layered compound on the basis of the relationship between the remnant polarization and the degree of short-circuiting.

Although in the aforementioned example, the bismuth-layered compound of the formula $Bi_2SrTa_2O_9$ is exemplified as the object, bismuth compounds of other formulae can also be used to obtain thin films of the desired compositions.

The process for producing a bismuth compound according to the present invention is not limited to the aforementioned example and can adopt a wide variety constitutions within the sprit of the present invention.

According to the present process for producing a bismuth compound, the occurrence of an electrically conductive secondary phase can be inhibited by secondary formation of a small amount of an insulating phase with pyrochlore structure in the bismuth-layered compound. Hence, when applied to materials such as capacitor, this bismuth compound can give a capacitor excellent in characteristics with a lower degree of short-circuiting.

Further, the pyrochlore structure is nonstoichiometric to a certain degree though not so high as the fluorite structure and it is tolerant to strain in the composition, so there may be further effects such as inhibition of formation of other secondary phases.

By virtue of its tolerance to strain in the composition, the bismuth compound is relative tolerant to various manufacturing conditions and can thus be produced more easily.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A process for producing a bismuth compound layer on a substrate comprising the steps of:

providing a solution of $BiPh_3$, $Sr(DPM)_2$, and $Ta(O—iPr)_5$ source materials in tetrahydrofuran solvent, said solution having an atomic composition ratio of Bi/Sr/Ta of 2/1/½;

transferring said solution to a heated vaporization unit so as to produce a vaporized solution;

transporting the vaporized solution with an argon carrier gas to a reactor containing a substrate, said substrate being at a temperature of 600° C. and said reactor being at a pressure of 10 Torr;

transporting oxygen gas into the reactor separately from the vaporized solution so as to provide a partial pressure of oxygen in a range of 20% to 45% of the total pressure in said reactor;

depositing a precursor of said bismuth compound layer on said substrate from said vaporized solution and said oxygen, said precursor having a fluorite-structured phase and an amorphous phase; and thermally treating said precursor at a temperature of 800° C. for one hour in a stream of oxygen to provide said bismuth compound layer, said bismuth compound layer including $Bi_2SrTa_2O_9$ as a main phase thereof and composite oxides of pyrochlore structure as a secondary phase thereof.

* * * * *